United States Patent [19]

Mori

[11] Patent Number: 5,216,353
[45] Date of Patent: Jun. 1, 1993

[54] DC POWER DEVICE

[75] Inventor: Isao Mori, Nagoya, Japan

[73] Assignee: Brother Kogyo Kabushiki Kaisha, Japan

[21] Appl. No.: 829,322

[22] Filed: Feb. 3, 1992

[30] Foreign Application Priority Data

Feb. 14, 1991 [JP] Japan ................................. 3-21045

[51] Int. Cl.$^5$ ............................................. G05F 1/563
[52] U.S. Cl. ..................................... 323/266; 323/224; 323/281; 323/288
[58] Field of Search ............... 323/266, 267, 273, 274, 323/281, 349, 351, 222, 226, 223, 224, 288

[56] References Cited

U.S. PATENT DOCUMENTS

| | | |
|---|---|---|
| 3,733,540 | 5/1973 | Hawkins ................................ 321/47 |
| 4,131,938 | 12/1978 | Milberger et al. .................... 363/101 |
| 4,318,039 | 3/1982 | Abbott .................................. 323/273 |
| 4,538,102 | 8/1985 | Takagi et al. ......................... 323/349 |
| 4,658,201 | 4/1987 | Notohamiprodjo ................... 323/224 |
| 4,893,228 | 1/1990 | Orrick et al. ......................... 363/89 |
| 4,915,546 | 4/1990 | Kobayashi et al. ................... 400/697 |
| 4,962,350 | 10/1990 | Fukuda ................................ 323/283 |

Primary Examiner—Emanuel T. Voeltz
Assistant Examiner—Adolf Berhane
Attorney, Agent, or Firm—Oliff & Berridge

[57] ABSTRACT

Feedback resistors including a dividing resistor are provided at the output terminal of a switching regulator to divide an output voltage supplied by the switching regulator. The terminals of at least one of the feedback resistors are connected to the collector and emitter respectively of a transistor, and the base of the transistor is supplied with a control signal which can be output, for example, from a controller. The transistor is switched ON in response to the control signal when a load requiring a high operating voltage, such as, for example, a printing unit is not operated, thereby causing the switching regulator to generate a low target voltage which is then used to generate a low operating voltage by a linear regulator (for powering loads requiring the low operating voltage). The transistor is switched OFF in response to the control signal when the load requiring the high operating voltage (e.g., the printing unit) is operated, thereby causing the switching regulator to generate a high target voltage which is used as the high operating voltage required for driving the, for example, printing unit.

20 Claims, 8 Drawing Sheets

PRIOR ART

DC POWER DEVICE

BACKGROUND OF THE INVENTION

1. Field of the Invention

This invention relates to a DC power device including a switching regulator and a linear regulator for applying a DC voltage produced by each regulator to an external load.

2. Discussion of Related Art

In electrical equipment having electrical elements requiring different operating voltages such as, for example, a word processor having a printing motor as an element of a high-voltage driving system, and a document-preparation control circuit as an element of a low-voltage driving system, a DC power device is provided which is capable of individually supplying each electrical element with a voltage suitable as the operating voltage for that electrical element.

Figure 8:
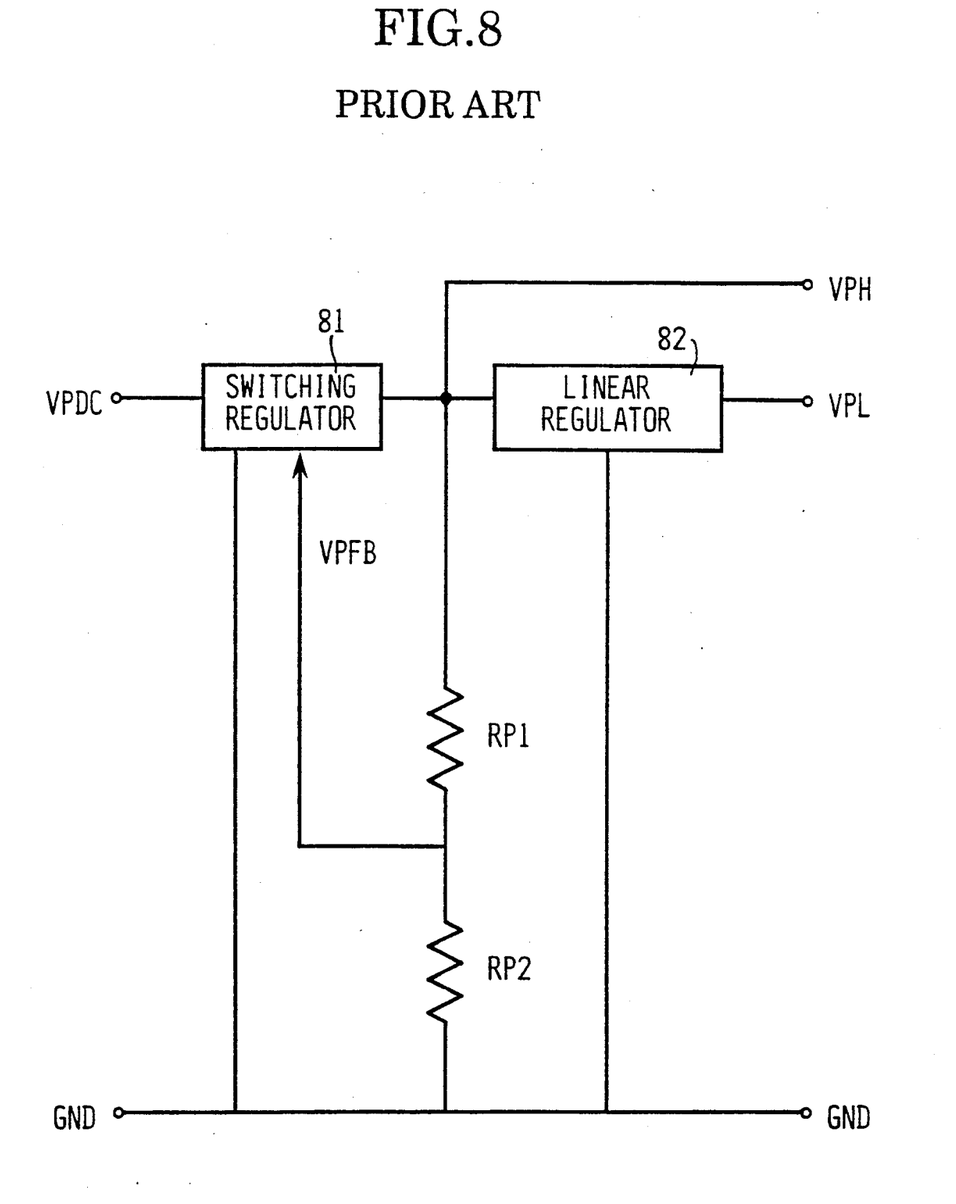
FIG. 8 is a circuit diagram of a prior art DC power device.

A DC power device which supplies different operating voltages is known, and includes a chopper or inverter type of switching regulator and a series or shunt type of linear regulator as shown in FIG. 8. In this DC power device, a DC voltage (VPDC) which is obtained by rectifying and smoothing a commercial voltage is first supplied to the switching regulator 81, which then generates a predetermined high voltage (VPH), suitable for powering electrical elements of the high-voltage system. The high voltage (VPH) generated by the switching regulator is also supplied to the linear regulator 82 to generate a predetermined low voltage (VPL), suitable for powering electrical elements of the low-voltage system.

The conventional DC power device described above can stably generate two types of DC voltages: a high voltage (VPH); and a low voltage (VPL) using the regulators 81 and 82, respectively, and can also stably supply a source voltage (operating voltage) to a load irrespective of fluctuation of the load. However, the linear regulator of this conventional DC power device suffers a large power loss because a linear regulator 82 having a low conversion efficiency is used to convert the high voltage (VPH) to the low voltage (VPL). Additionally, large circuit elements for the regulator, and a large heat sink for dissipating heat generated in the circuit elements are required. Therefore, these DC power devices cannot be used when high efficiency and miniaturization of the DC power device are required.

In order to overcome the above disadvantages, it is proposed to use a switching regulator having high conversion efficiency for the generation of a low voltage as well as a high voltage. However, this proposal has the following disadvantage: in the switching regulator, an input voltage (DC voltage) is once converted into an AC voltage, and then the AC voltage is rectified and smoothed to generate a predetermined DC voltage; thus, when a linear regulator is replaced by the switching regulator, there would occur new problems in that the number of electrical elements is increased, thus increasing the cost of the device, and countermeasures for handling noise must be provided because noise is liable to occur due to a switching operation performed therein.

SUMMARY OF THE INVENTION

An object of this invention is to provide a DC power device for generating high and low source (operating) voltages using a switching regulator and a linear regulator in which power loss in the linear regulator is reduced, and thus high and low source voltages are effectively generated.

To achieve the foregoing and other objects, and to overcome the shortcomings discussed above, a DC power device for generating and outputting plural voltages suitable for powering external loads includes: a switching regulator for converting a DC voltage to a target voltage, the target voltage being indicated externally of the switching regulator, so that the switching regulator outputs the target voltage; feedback means for supplying the switching regulator with a feedback signal corresponding to the output voltage of the switching regulator; a linear regulator for converting the output voltage (the target voltage) of the switching regulator to a desired voltage lower than the output voltage, and for outputting the desired voltage; determining means for determining whether the output voltage (target voltage) of the switching regulator is being directly supplied to an external load without passing the output voltage through the linear regulator; and target voltage indicating means for indicating the target voltage in accordance with the determination made by the determination means, so that when the output voltage of the switching regulator is supplied directly to the external load, the target voltage is higher than the target voltage when the output voltage of the switching regulator is not directly supplied to the external load.

Therefore, when the output voltage provided by the switching regulator is not directly supplied to the external load, the switching regulator generates a (target) voltage lower than a (target) voltage when the output voltage provided by the switching regulator is directly supplied to the external load. Thus, the voltage input to the linear regulator in the present invention is lower as compared with conventional devices. When a high operating voltage is required, the target voltage output by the switching regulator is the high operating voltage. If external loads requiring the lower operating source voltage are operated simultaneously with the external loads requiring the high operating source voltage, the high source voltage is also supplied to a linear regulator, which then outputs the low operating voltage. When only a low operating voltage is required, the target voltage is lowered (below the high operating voltage), and is then supplied to the linear regulator, which then outputs the low operating voltage.

BRIEF DESCRIPTION OF THE DRAWINGS

The invention will be described in detail with reference to the following drawings in which like reference numerals refer to like elements, and wherein.

DETAILED DESCRIPTION OF THE PREFERRED EMBODIMENTS

The schematic construction of a word processor 1 to which a first embodiment of the DC power device of this invention is applied will be described with reference to FIGS. 1 and 2.

The word processor of this embodiment has substantially the same construction as the word processor disclosed in U.S. Pat. No. 4,915,546, except for the presently disclosed power source unit 20 and a control operation of the power source unit 20 performed by a controller 11. Accordingly, U.S. Pat. No. 4,915,546 is incorporated herein by reference.

Figure 1:
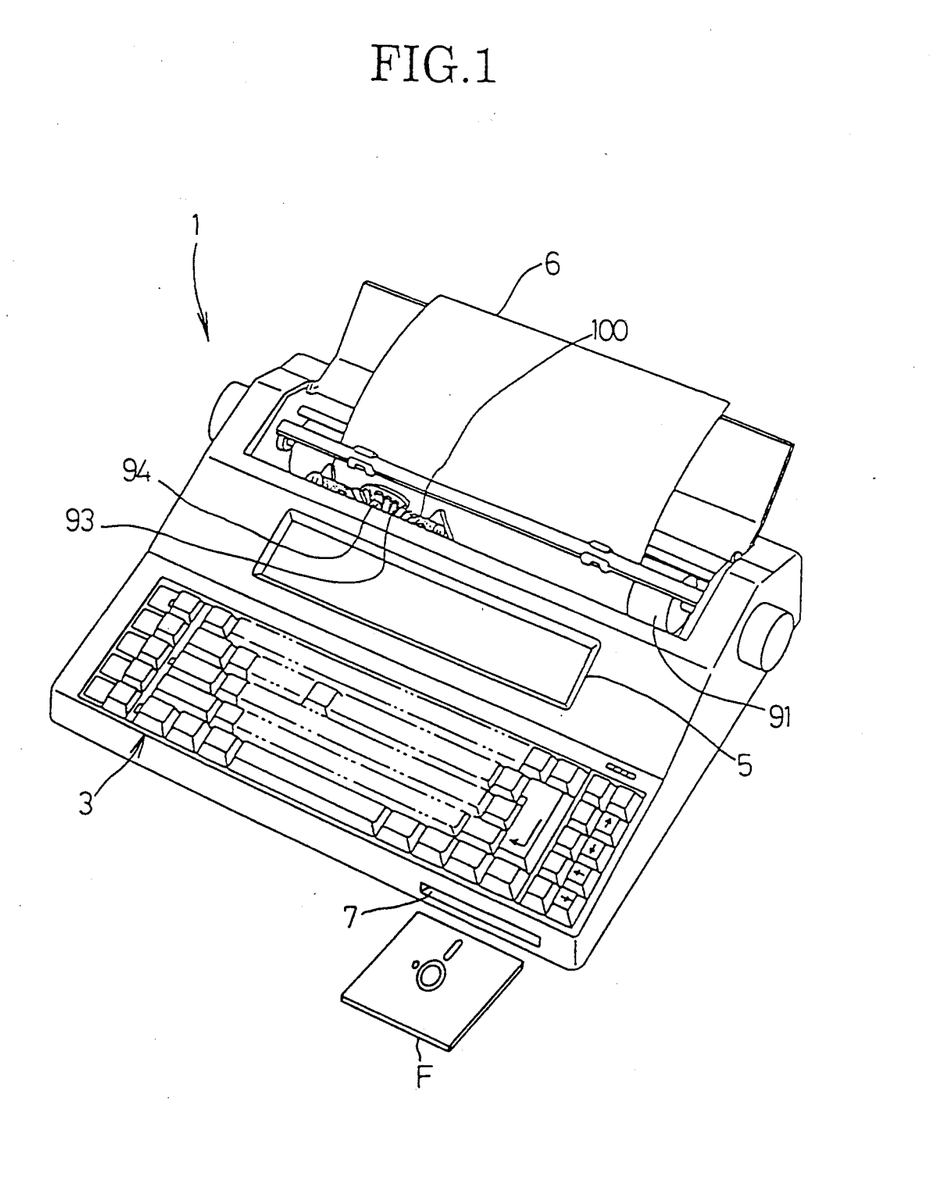
FIG. 1 is a perspective view of a word processor to which an embodiment of the DC power device according to this invention is applied.
Figure 2:
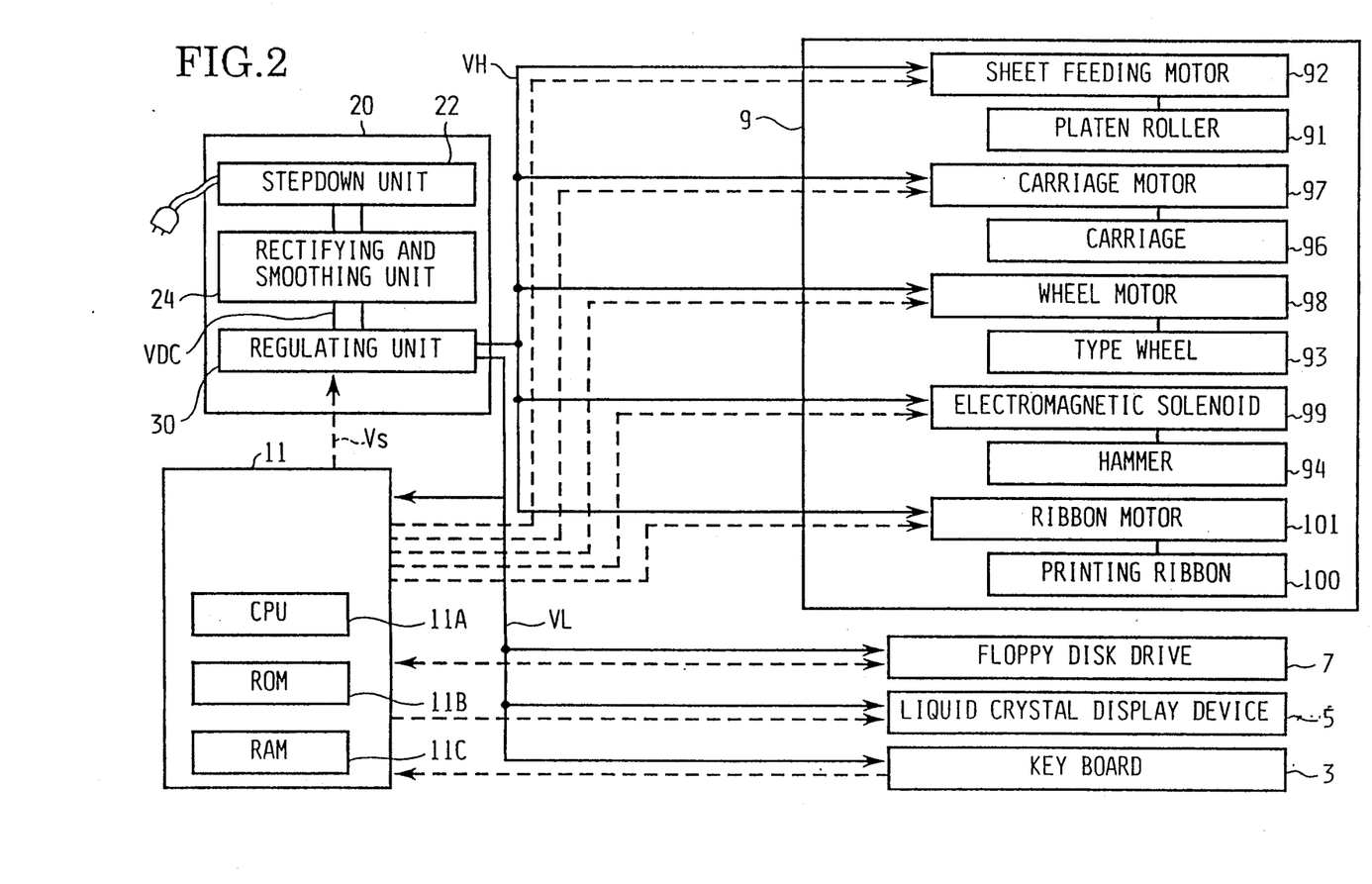
FIG. 2 is a block diagram illustrating elements of the word processor of FIG. 1.

As shown in FIGS. 1 and 2, the word processor 1 comprises a keyboard 3 for inputting therethrough character data or various editing instructions, a liquid crystal display device 5 for displaying document data or the like during an editing operation, a floppy disk driver (FDD) 7 for reading and writing document data on a floppy disk F, a printing unit 9 for printing prepared document data onto a recording sheet 6, a controller 11 for controlling the driving of the above electrical elements, and a power source unit 20 for generating a high voltage VH and a low voltage VL, and for supplying the voltages to the above electrical elements.

The printing unit 9 comprises: a sheet feeding motor 92 for driving a sheet supply system, including a platen roller 91; a carriage motor 97, for moving a carriage 96 along a recording sheet 6, on which a type wheel 93, a hammer 94 and a printing ribbon 100 are mounted; a wheel motor 98 for selecting a printing type for the type wheel 93; an electromagnetic solenoid 99 for driving the hammer 94; and a ribbon motor 101 for driving the printing ribbon 100. The motors 92, 97, 98 and 101, and the electromagnetic solenoid 99 can be actuated (or energized) upon receipt of the high operating voltage VH (9 V) generated in the power source unit 20, and operated in response to a control signal output from the controller 11.

The controller 11 comprises a conventional microcomputer which includes a CPU 11A, a ROM 11B in which programs for controlling the respective electrical elements are stored, and a RAM 11C. Controller 11 can be actuated upon receipt of a low operating voltage VL (5 V) generated in the power source unit 20. Other elements which use the lower operating voltage VL include the keyboard 3, the liquid crystal display device 5 and the FDD 7. The controller executes conventional document preparation processing in response to input data supplied via keyboard 3, and also: alters a message displayed on the liquid crystal display device 5; and drives the FDD 7 and the printing unit 9 as occasion demands. Further, the controller 11 of this invention is designed so as to output to the power source unit 20 a control signal Vs whose level is switched to a low level during an operating time of the printing unit 9, and to a high level during a non-operating time of the printing unit 9.

The printing unit 9 is controlled by the controller 11, and thus the control signal Vs is reliably output from the controller 11 in accordance with a driving state of the printing unit 9. That is, since controller 11 controls printing unit 9, the appropriate value of Vs can be easily provided in synchronism with the state of printing unit 9.

The power source unit 20 includes: a stepdown (voltage reducing) unit 22 comprising a stepdown transformer for reducing a commercial source voltage (for example, AC 100 V) to a predetermined alternating voltage (for example, AC 11 V); a rectifying and smoothing unit 24 for rectifying and smoothing the alternating voltage from the stepdown unit 22 to output a predetermined DC voltage VDC (for example, DC 14 V); and a regulating unit 30 for receiving the output voltage VDC from the rectifying and smoothing unit 24 to generate DC high and low operating voltages VH and VL to be supplied as source voltages.

Figure 3:
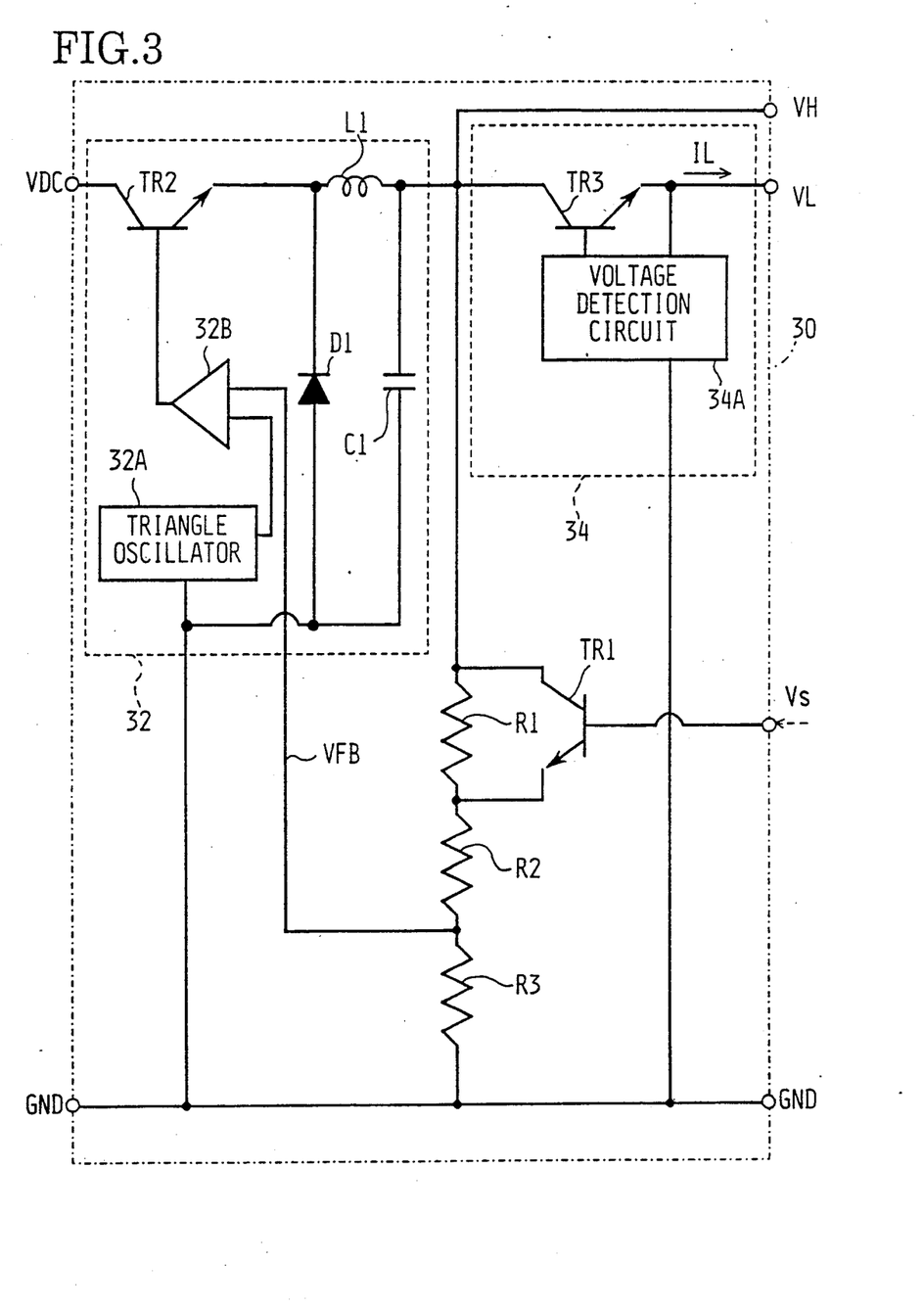
FIG. 3 is a circuit diagram illustrating electrical components or elements of a DC power device according to a first embodiment of the invention.

As shown in FIG. 3, the regulating unit 30 includes a chopper-type of switching regulator 32 for generating the high voltage VH from the output voltage VDC of the rectifying and smoothing unit 24, and a series-type of linear regulator 34 for generating the low voltage VL from the high voltage VH. Thus, regulating unit 30 supplies the high and low voltages VH and VL generated in the respective regulators 32 and 34 to the appropriate electrical components of the word processor.

The chopper regulator 32 includes a triangle oscillator 32A, a pulse width modulation comparator (PWM comparator) 32B, a diode DI, a capacitor C1, a coil L1, and a transistor TR2, and as is well known, carries out feedback control of the output VH via the input of a feedback voltage VFB to the PWM comparator 32B, the feedback voltage VFB being equal to a predetermined voltage. In this embodiment of the present invention, three feedback resistors R1 to R3 are provided at the output terminal of the chopper regulator 32. Feedback resistor R3 is a dividing resistor. As can be seen from FIG. 3, the voltage between the output terminal of the dividing resistor R3 and ground is input as the feedback voltage VFG to the chopper regulator 32, thereby operating the chopper regulator 32 with feedback control. Therefore, the output voltage VH of the chopper regulator 32 is controlled to be equal to a constant voltage which is determined by the feedback voltage VFB and the feedback resistors R1 to R3, irrespective of variation of a load applied to the chopper regulator 32.

The series regulator 34 includes a voltage detection circuit 34A and a transistor TR3, and is well known as a three-terminal linear regulator serving to output a stable voltage with internal loss due to class "A" operation of the transistor TR3.

In this embodiment of the present invention, in the three feedback resistors R1 to R3 provided at the output terminal of the chopper regulator 32, the terminals of the feedback resistor R1 (the feedback resistor located closest to the output terminal side of the chopper regulator 32) are connected to the collector and emitter, respectively, of a transistor TR1. When the transistor TR1 is switched ON, the output voltage VH of the chopper regulator 32 is controlled to be a lower voltage (6 V) than a voltage (9 V) provided by the chopper regulator 32 when the transistor TR1 is in an OFF-state. That is, the output voltage VH of the chopper regulator 32 when the transistor TR1 is in the OFF-state is controlled so as to satisfy the following equation (1).

$$VH = VFB(R1 + R2 + R3)/R3 \qquad (1)$$

When the transistor TR1 is switched ON, the feedback resistor R1 is short-circuited so that the output voltage VH of the chopper regulator 32 is controlled to satisfy the following equation (2) and is set to be lower than the voltage when the transistor TR1 is in the OFF-state.

$$VH = VFB(R2+R3)/R3 \quad (2)$$

Accordingly, in this first embodiment of the invention, the control signal Vs output from the controller 11 is applied to the base of transistor TR1, whereby the transistor TR1 is switched ON (by making the value of Vs high) during the non-operation times of the printing unit 9 to allow the chopper regulator 32 to generate the minimum voltage (6 V) required for the generation of the low operating voltage VL (5 V) by the series regulator 34. When the printing unit 9 is in operation, controller 11 controls the control signal Vs (by making the value of Vs low) so that the transistor TR1 is switched OFF to allow the chopper regulator 32 to generate the high voltage (9 V) required for driving of the printing unit 9. When the high (9 V) voltage is output by the chopper regulator 32, the series regulator 34 receives the high (9 V) voltage, and still outputs the low (5 V) voltage.

Figure 4A:
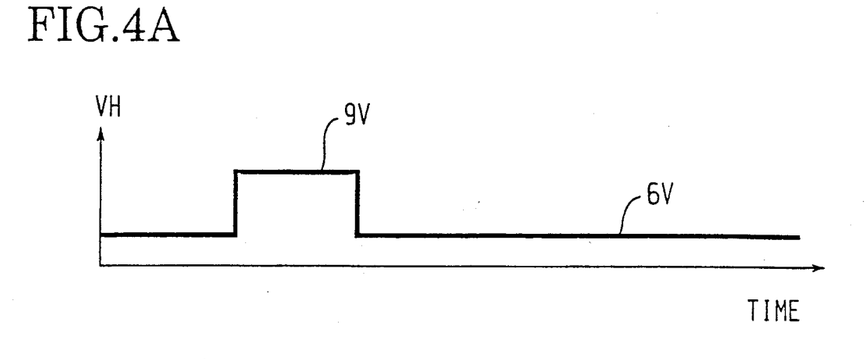
FIGS. 4A, 4B, 4C and 4D are time charts illustrating operation of the electrical elements shown in FIG. 3.
Figure 4B:
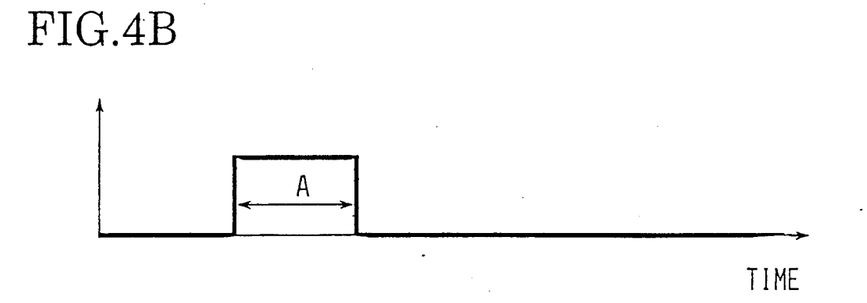

Accordingly, as shown in FIGS. 4A and 4B, in the power source unit 20 of this first embodiment, a constant voltage 9 V required for the driving of the printing unit 9 is generated by chopper regulator 32 as the high voltage VH during the operating time of the printing unit 9, and a constant voltage (6 V) which corresponds to the minimum voltage required for generating the low voltage VL(5 V) in the series regulator 34 is generated by chopper regulator 32 as the high voltage during the non-operating time of the printing unit 9. As a result of this control, the power loss (=(VH−VL)×load current) in the series regulator 34 can be reduced as will be demonstrated below.

Figure 4C:
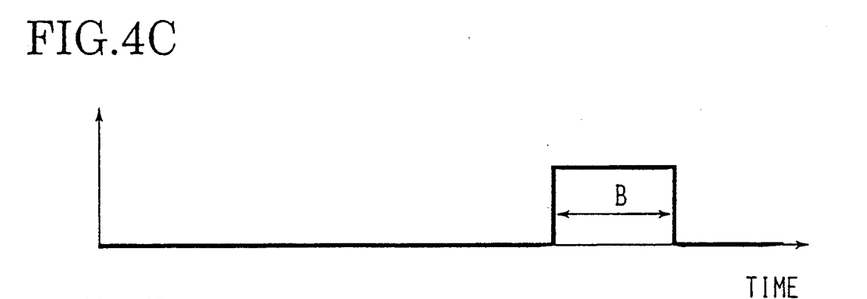
Figure 4D:
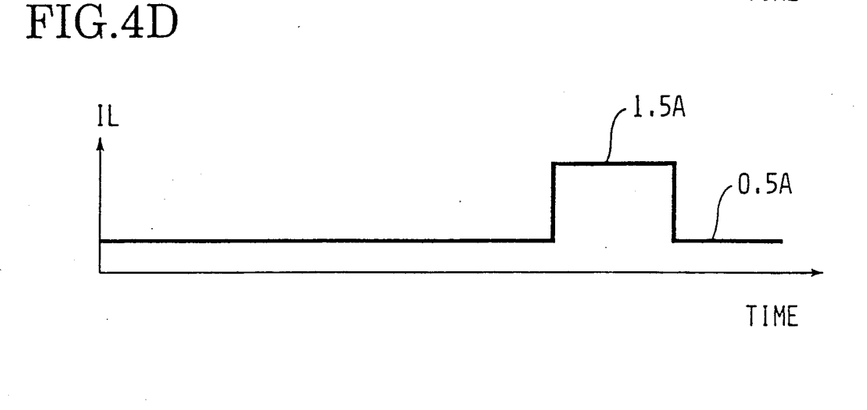

In this first embodiment, the keyboard 3, the liquid crystal device t and the controller 11 are supplied with the source voltages from the power source unit 20 at all times, while the other elements, such as, for example, the FDD 7 and the printing unit 9 are selectively driven by the controller 11. In the illustrated embodiment, the FDD 7 and the printing unit 9 are not simultaneously driven, since it is not necessary to read or write on a floppy disc F during a printing operation. Additionally, the keyboard 3, the liquid crystal display device 5, the controller 11 and the FDD 7 are driven with the low operating voltage (5 V), while the printing unit 9 is driven with the high operating voltage (9 V). Accordingly, a power loss W1 in the series regulator 34 during the non-operating times of the FDD 7 and the printing unit 9, a power loss W2 in the series regulator 34 during the operating time of the printing unit 9 (an area A of FIG. 4B) and a power loss W3 in the series regulator 34 during the operating time of the FDD 7(an area B of FIG. 4C) satisfy the following equations (3) to (5) respectively because the voltage VH input to the series regulator 34 and the load current IL output from the series regulator 34 have pulse waves as shown in FIGS. 4A and 4D (i.e., the load current IL is 0.5 amps unless FDD7 is operating, in which case IL=1.5 amps).

$$W1 = (6-5) \times 0.5 = 0.5 W \quad (3)$$

$$W2 = (9-5) \times 0.5 = 2.0 W \quad (4)$$

$$W3 = (6-5) \times 1.5 = 1.5 W \quad (5)$$

As is apparent from the above equations, the maximum power loss does not exceed 2.0 W. Therefore, in comparison with conventional devices which do not perform the function of switching the output voltage VH of the chopper regulator 32 (in these conventional devices, the maximum power loss is equal to $(9-5) \times 1.5 = 6W$), the power loss in the series regulator 34 can be substantially reduced with the present invention.

Accordingly, with this embodiment of the invention, the entire power demand of the device can be reduced, and therefore miniaturization of the circuit elements of the series regulator 34 and the heat sink, and thus miniaturization of the power source unit 20, is facilitated.

In this first embodiment: the transistor TR1 corresponds to a target voltage switching means in that a target voltage (the voltage output by the switching regulator 32) is switched by the state of transistor TR1; and the controller 11 corresponds to a determining means for outputting a control signal (Vs) for controlling the switching state (ON-state and OFF-state) of the transistor TR1 (the target voltage switching means). Of course, other types of switches (such as mechanically actuated switches) can be used as a target voltage switching means. Additionally, and as will be demonstrated below in FIG. 5, means other than controller can be used as a determining means for outputting a control signal to the target voltage switching means.

Figure 5:
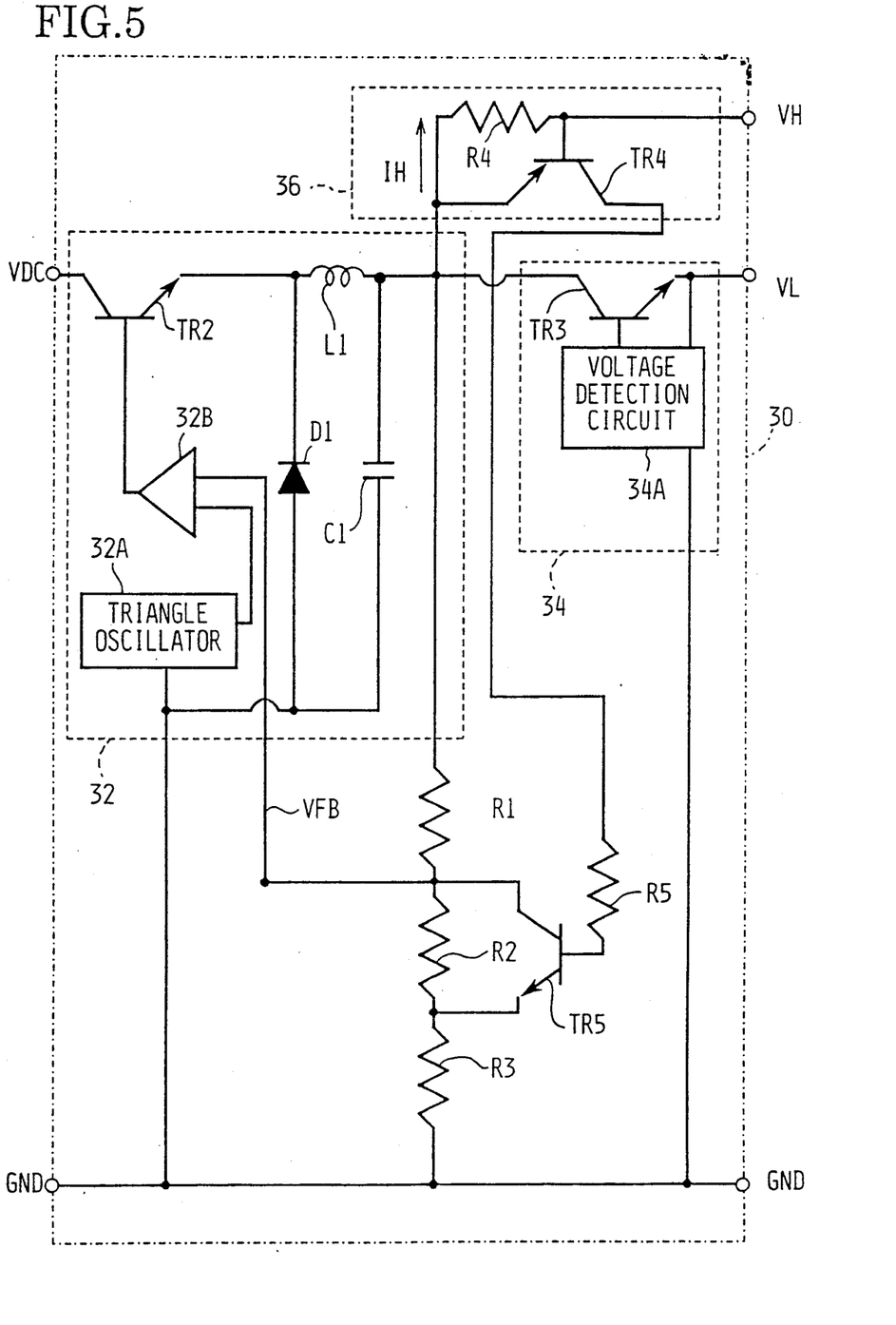
FIG. 5 is a circuit diagram illustrating another embodiment of the DC power device of this invention.

The power device of the above embodiment is constructed so that the control signal Vs for the voltage switching operation is output by the controller for providing an operating voltage appropriate for driving the high-voltage load (that is, the printing unit 9). However, the present invention is not limited to the above construction. For example, as shown in FIG. 5, a current detection circuit 36 including a resistor R4, and a transistor TR4 for detecting a load current IH supplied from the regulator 32 to the printing unit 9, may alternatively be provided. In the FIG. 5 construction, when a load current IH flowing into the printing unit 9 is detected by the current detection circuit 36 (indicating operation of the printing unit 9), a signal (control signal) indicating detection of the load current IH flows through the transistor TR4 and a resistor R5 to a transistor TR5. In response to the control signal, the transistor TR5 is switched OFF to control the feedback voltage VFB as described above with respect to FIG. 3. Accordingly, in the FIG. 5 embodiment, controller does not supply control signal Vs (although it should be noted that since controller 11 actuates printing unit 9, the controller 11 indirectly causes transistor TR5 to switch states).

Figure 6:
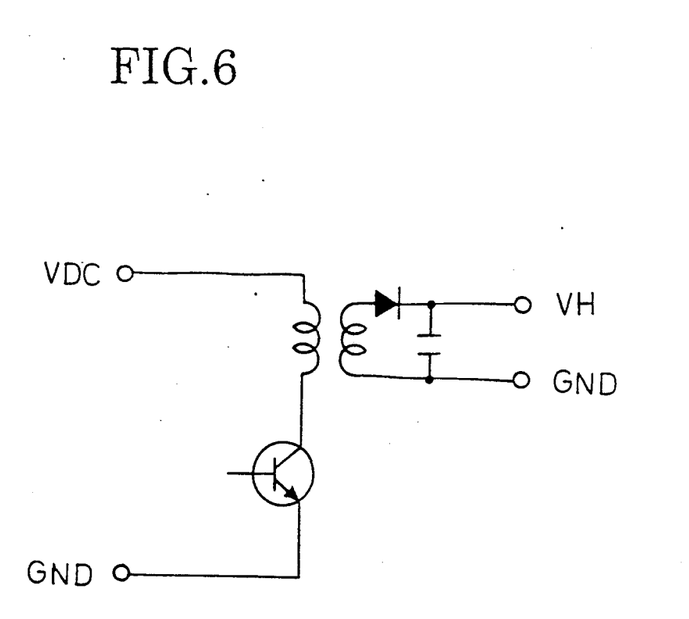
FIG. 6 is a circuit diagram of an inverter-type of switching regulator.
Figure 7:
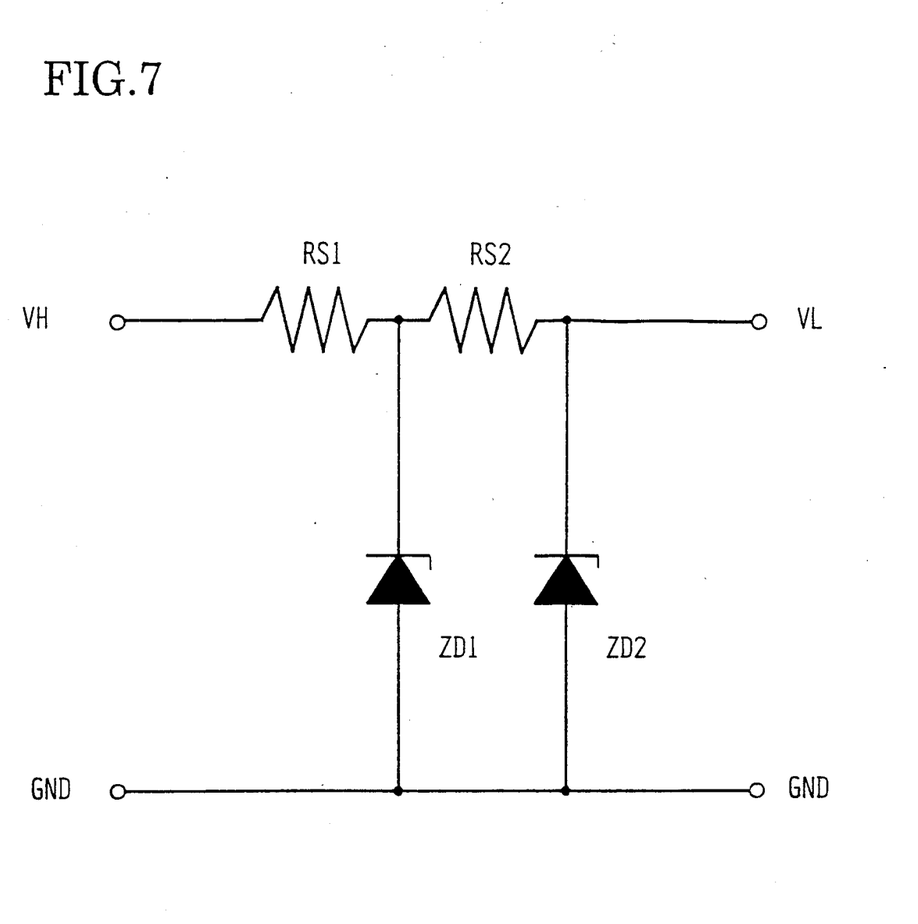
FIG. 7 is a circuit diagram of a shunt-type linear regulator.

In the above-described embodiments, the power device is described as having a chopper-type of switching regulator (chopper regulator 32) and a series-type of linear regulator (series regulator 34). However, the present invention can be applied to a power device using a conventional inverter-type of regulator as shown in FIG. 6 as the switching regulator, or a conventional shunt-type of regulator as shown in FIG. 7 as the linear regulator.

Further, the above examples describe the power device of the present invention as applied to a word processor. However, the power device of the present invention may be applied to any type of electrical equipment requiring two different source voltages (e.g. high and low voltages).

As described above, according to this invention, the output voltage of the switching regulator is set to a low voltage when the output voltage is not supplied to a high-voltage requiring external load (e.g., a printing unit 9), so that the power loss in the linear regulator can be reduced. Therefore, the entire power demand of the device can be reduced, and the circuit elements of the linear regulator and the heat sink for the circuit elements can be miniaturized to facilitate miniaturization of the power device.

While this invention has been described in conjunction with specific embodiments thereof, it is evident that many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. A DC power device for generating and outputting plural voltages suitable for powering external loads comprising:
    a switching regulator for converting a DC voltage to a target voltage, the target voltage being indicated externally of the switching regulator so that the switching regulator outputs the indicated target voltage;
    feedback means for supplying the switching regulator with a feedback signal corresponding to the output voltage of the switching regulator;
    a linear regulator for converting the output voltage of the switching regulator to a desired voltage lower than the output voltage of the switching regulation and for outputting said desired voltage;
    determining means for determining whether the output voltage of the switching regulator is being directly supplied to an external load without passing the output voltage through the linear regulator and for outputting a control signal; and
    target voltage indicating means for indicating the target voltage in accordance with the control signal output by the determining means so that when the output voltage of the switching regulator is supplied directly to the external load, the target voltage is a first target voltage having a value higher than a second target voltage output by said switching regulator when the desired voltage of the linear regulator is supplied to the external load and the output voltage of the switching regulator is not directly supplied to the external load.

2. The device of claim 1, wherein said switching regulator is a chopper regulator.

3. The device of claim 1, wherein said linear regulator is a series regulator.

4. The device of claim 1, wherein said external load to which the output voltage of said switching regulator is directly supplied is a printing unit of an electric typewriter, said DC power device also being an integral part of said electric typewriter.

5. The device of claim 1, wherein said target voltage indicating means includes a switch having ON and OFF states, the state of said switch corresponding to the control signal output by said determining means, said target voltage changing with the state of said switch.

6. The device of claim 5, wherein said target voltage is said first target voltage when said switch is in the OFF state, and is said second target voltage when said switch is in the ON state.

7. The device of claim 5, wherein said switch is a transistor.

8. The device of claim 7, wherein said control signal output by said determining means is supplied to a base terminal of said transistor.

9. The device of claim 1, wherein said determining means is a controller coupled to the external loads and to said target voltage indicating means, said controller providing said control signal to said target voltage indicating means in accordance with the external loads being operated by said controller.

10. The device of claim 1, wherein said determining means is a current detection circuit coupled to an output of said switching regulator and said target voltage indicating means, said current detection circuit providing said control signal to said target voltage indicating means in accordance with a load current supplied by said switching regulator.

11. The device of claim 1, wherein said feedback means includes a plurality of feedback resistors coupled between an output of said switching regulator and a feedback input of said switching regulator, said feedback means providing a feedback signal to said feedback input, and wherein said target voltage indicating means includes a switch coupled to at least one of said feedback resistors for selectively varying a resistance of said feedback means so that said feedback signal varies in accordance with a state of said switch, said control signal being supplied to said switch.

12. The device of claim 11, wherein said plurality of feedback resistors are provided in series, said switch being coupled between opposite terminals of one of said feedback resistors, and wherein one of said feedback resistors is a dividing resistor having one terminal attached to ground, and a second terminal attached to said feedback input of said switching regulator.

13. A DC power device for generating and outputting plural voltages suitable for powering external loads requiring different operating voltages, comprising:
    a switching regulator for converting a DC voltage to a target voltage, and outputting said target voltage;
    a feedback circuit coupled between an output of said switching regulator and a feedback input of said switching regulator, said feedback circuit providing a feedback signal to said feedback input of said switching regulator to control the target voltage out put by said switching regulator;
    a linear regulator, coupled to the output of said switching regulator, for converting the target voltage output by said switching regulator to a desired voltage lower than said target voltage, and for outputting said desired voltage; and
    target voltage indicating means, coupled to said feedback circuit, for indicating whether the target voltage to be output by said switching regulator to said feedback circuit is to be a high target voltage or a low target voltage, so that said feedback circuit controls said switching regulator to output said high target voltage when said target voltage is supplied directly to an external load and to output said low target voltage when said target voltage is not directly supplied to an external load, both said high and said low target voltages being sufficiently high to enable said linear regulator to output said desired voltage.

14. The device of claim 13, further comprising:

a first terminal coupled to said linear regulator for supplying said desired voltage to one or more external loads requiring a low operating voltage; and a second terminal coupled to said switching regulator for supplying said target voltage to one or more external loads requiring a high operating voltage.

15. The device of claim 14, further comprising:

determining means for determining whether said one or more external loads requiring a high operating voltage are operating, said determining means providing a control signal to said target voltage indicating means in accordance with said determination, so that said feedback circuit controls said switching regulator so that said high target voltage is equal to said high operating voltage when said one or more external loads requiring said high operating voltage are determined to be operating.

16. The device of claim 13, wherein said switching regulator is a chopper regulator.

17. The device of claim 13, wherein said linear regulator is a series regulator.

18. The device of claim 15, wherein said target voltage indicating means includes a switch having ON and OFF states, the state of said switch corresponding to the determination made by said determining means and being controlled by said control signal, said target voltage changing between said high and said low target voltages with the state of said switch.

19. The device of claim 15, wherein said determining means is a controller coupled to the external loads and to said target voltage indicating means, said controller providing said control signal to said target voltage indicating means in accordance with the external loads being operated by said controller.

20. The device of claim 15, wherein said determining means is a current detection circuit coupled to an output of said switching regulator and said target voltage indicating means, said current detection circuit providing said control signal to said target voltage indicating means in accordance with a load current supplied by said switching regulator.

* * * * *